(12) United States Patent
Hsieh et al.

(10) Patent No.: US 8,497,571 B2
(45) Date of Patent: *Jul. 30, 2013

(54) THIN FLIP CHIP PACKAGE STRUCTURE

(75) Inventors: Chin-Tang Hsieh, Kaohsiung (TW);
Hou-Chang Kuo, Kaohsiung (TW);
Dueng-Shiu Tzou, Kaohsiung (TW);
Chia-Jung Tu, Hsinchu County (TW);
Gwo-Shyan Sheu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 213 days.

This patent is subject to a terminal disclaimer.

(21) Appl. No.: 13/163,913

(22) Filed: Jun. 20, 2011

(65) Prior Publication Data
US 2012/0080783 A1    Apr. 5, 2012

(30) Foreign Application Priority Data

Sep. 30, 2010   (TW) .............................. 99218883 U

(51) Int. Cl.
*H01L 23/58*    (2006.01)
(52) U.S. Cl.
USPC .................................. 257/675; 257/E23.033

(58) Field of Classification Search
USPC ........................................ 257/675, E23.033
See application file for complete search history.

(56) References Cited

U.S. PATENT DOCUMENTS

| 6,794,273 B2 * | 9/2004 | Saito et al. | 438/462 |
| 7,754,534 B2 * | 7/2010 | Saito et al. | 438/118 |
| 2003/0219969 A1 * | 11/2003 | Saito et al. | 438/622 |

* cited by examiner

*Primary Examiner* — Long Pham
*Assistant Examiner* — Steven Rao
(74) *Attorney, Agent, or Firm* — Jackson IPG PLLC

(57) ABSTRACT

A thin flip chip package structure comprises a substrate, a chip and a heat dissipation paste, the substrate comprises an insulating layer and a trace layer. The insulating layer comprises a top surface, a bottom surface and a plurality of apertures formed at the bottom surface, wherein the bottom surface of the insulating layer comprises a disposing area and a non-disposing area. Each of the apertures is located at the disposing area and comprises a lateral wall and a base surface. A first thickness is formed between the base surface and the insulating layer, a second thickness is formed between the top surface and the bottom surface, and the second thickness is larger than the first thickness. The chip disposed on the top surface comprises a chip surface and a plurality of bumps. The heat dissipation paste at least fills the apertures and contacts the base surface.

6 Claims, 5 Drawing Sheets

THIN FLIP CHIP PACKAGE STRUCTURE

CROSS REFERENCE TO RELATED APPLICATIONS

This application claims priority under 35 U.S.C. §119, to Taiwanese Application Number 099218883 filed in Taiwan, R.O.C. on Mar. 9, 2010 and is related to copending U.S. application Ser. No. 13/163,877, filed on Jun. 20, 2011.

FIELD OF THE INVENTION

The present invention is generally relating to a thin flip chip package structure, more particularly to a thin flip chip package structure with heat dissipation capability.

BACKGROUND OF THE INVENTION

With reference to FIG. 1, a conventional thin flip chip package structure 10 comprises a substrate 11, a chip 12, a dam 13, a sealing resin 14 and a heat dissipation paste 15. The substrate 11 comprises a top surface 11a, a bottom surface 11b, and a through hole 11c penetrating the top surface 11a and the bottom surface 11b. The chip 12 disposed on the top surface 11a of the substrate 11 is electrically connected with the substrate 11 and comprises a plurality of bumps 12a. The dam 13 is formed on the top surface 11a of the substrate 11 and located at outside of the through hole 11c. The sealing resin 14 is formed on the top surface 11a of the substrate 11, and the bumps 12a is covered by the sealing resin 14. The through hole 11c is filled with the heat dissipation paste 15. The dam 13 may be utilized to block the sealing resin 14 to prevent the sealing resin 14 from flowing into the through hole 11c of the substrate 11 to pollute the heat dissipation paste 15. However, an overhigh dam 13 makes the bumps 12a of the chip 12 difficult to connect with the substrate 11 smoothly. On the contrary, once the height of the dam 13 is insufficient, a gap (not shown in Figs.) between the dam 13 and the chip 12 is formed and enable the sealing resin 14 to flow from the gap to the through hole 11c of the substrate 11 therefore polluting the heat dissipation paste 15.

SUMMARY

The primary object of the present invention is to provide a thin flip chip package structure comprising a substrate, a chip and a heat dissipation paste. The substrate comprises an insulating layer and a trace layer, the insulating layer comprises a top surface, a bottom surface and a plurality of apertures formed at the bottom surface, wherein the bottom surface of the insulating layer comprises a disposing area and a non-disposing area located at outside of the disposing area. Each of the apertures is located at the disposing area and comprises a lateral wall and a base surface in connection with the lateral wall, a first thickness is formed between the base surface of each of the apertures and the top surface of the insulating layer, a second thickness is formed between the top surface and the bottom surface of the insulating layer, the second thickness is larger than the first thickness, and the trace layer is formed on the top surface of the insulating layer. The chip disposed on the top surface of the insulating layer comprises a chip surface and a plurality of bumps, the chip surface is corresponded to the disposing area, and the bumps are electrically connected with the trace layer. The heat dissipation paste at least fills the apertures and contacts the base surface of each of the apertures. For the reason that each of the apertures is disposed at the disposing area of the bottom surface of the insulating layer and comprises the lateral wall and the bottom surface, the apertures can be filled with the heat dissipation paste, and the lateral wall and the bottom surface of each of the apertures are in contact with the heat dissipation paste for raising the contact area between the heat dissipation paste and the insulating layer. Therefore, the coupling strength between the heat dissipation paste and the insulating layer can be effectively increased. Besides, when a sealing resin is formed on the top surface of the insulating layer, the sealing resin can be limited between the chip and the insulating layer, a dam for blocking the sealing resin is no longer needed. Therefore, mentioned design possesses functions of cost saving and shorter processing duration.

DETAILED DESCRIPTION OF THE INVENTION

Figure 1:
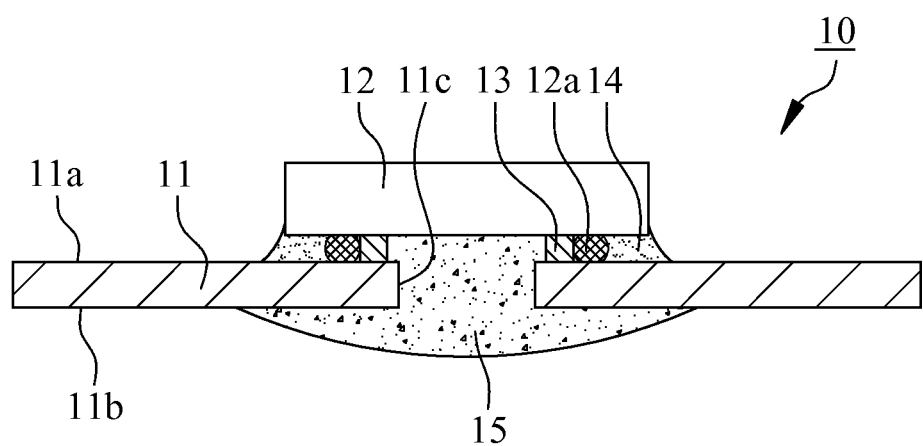
FIG. 1 is a cross-sectional schematic diagram illustrating a conventional thin flip chip package structure.
Figure 2:
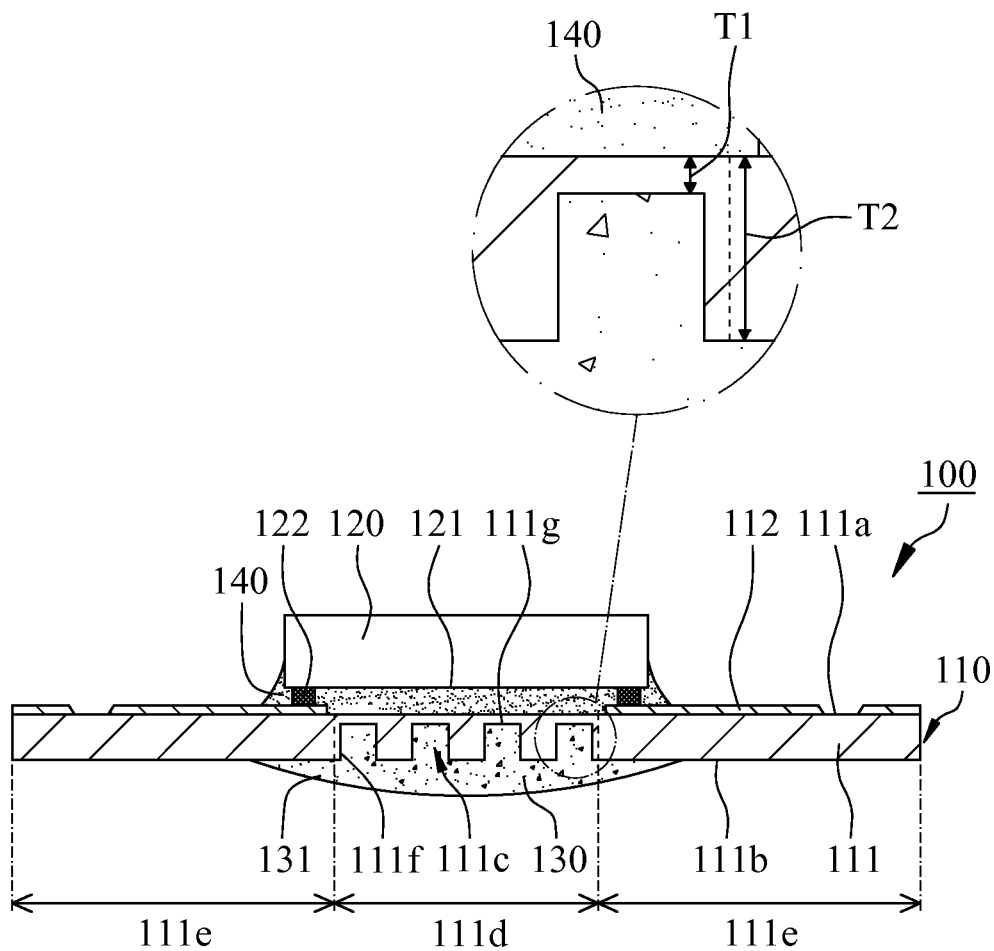
FIG. 2 is a cross-sectional schematic diagram illustrating a thin flip chip package structure in accordance with a preferred embodiment of the present invention.
Figure 3A:
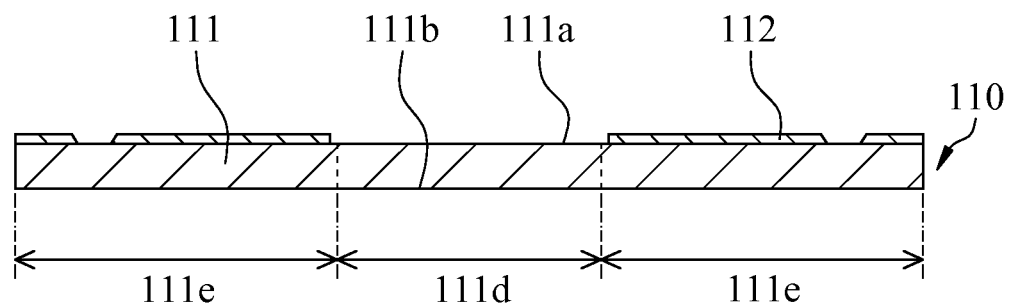
FIGS. 3A to 3D are cross-sectional views showing a manufacturing process of the thin flip chip package structure in accordance with a preferred embodiment of the present invention.
Figure 3B:
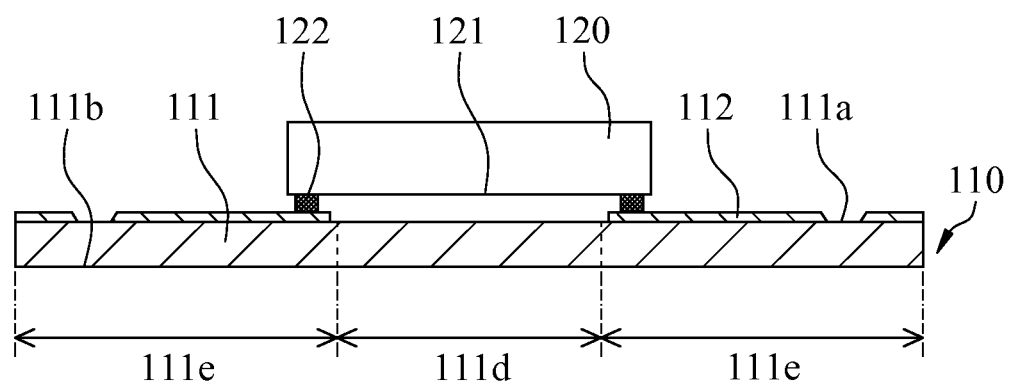
Figure 3C:
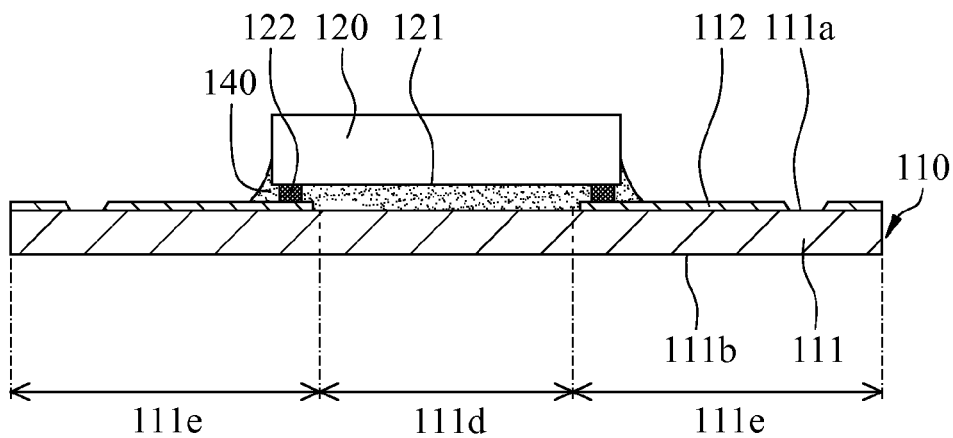
Figure 3D:
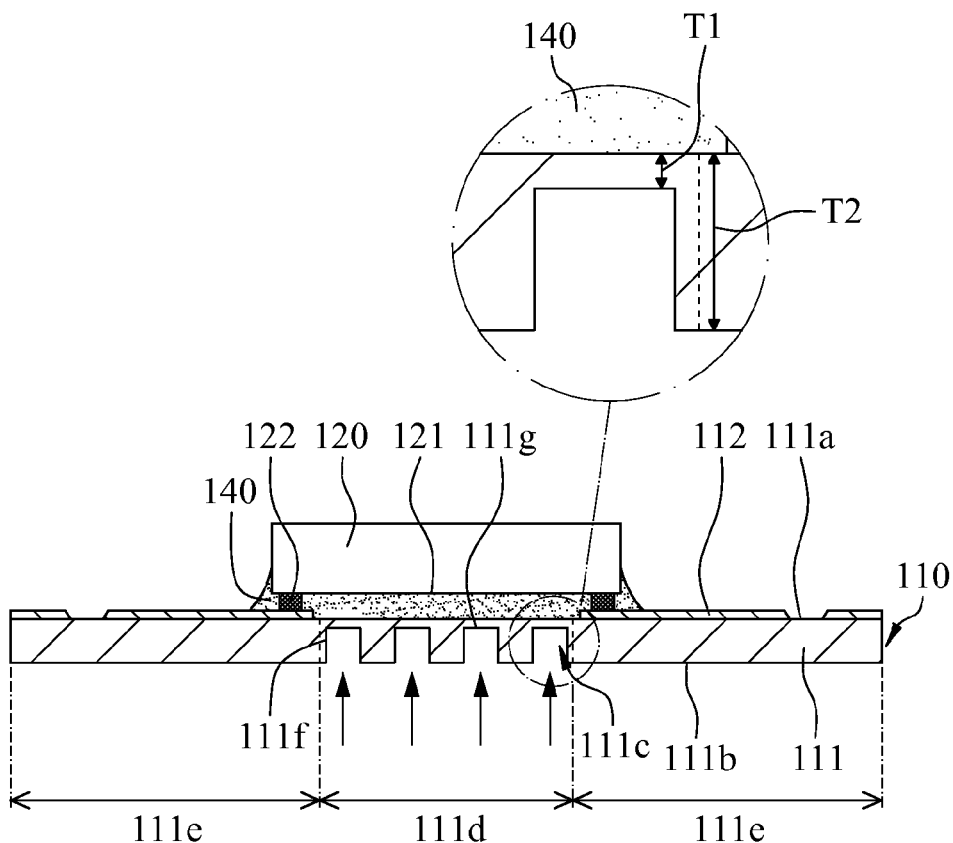

With reference to FIG. 2, a thin flip chip package structure 100 in accordance with a preferred embodiment of the present invention comprises a substrate 110, a chip 120, a heat dissipation paste 130 and a sealing resin 140. The substrate 110 comprises an insulating layer 111 and a trace layer 112, the insulating layer 111 comprises a top surface 111a, a bottom surface 111b and a plurality of apertures 111c formed at the bottom surface 111b, wherein the bottom surface 111b of the insulating layer 111 comprises a disposing area 111d and a non-disposing area 111e. Each of the apertures 111c is located at the disposing area 111d and comprises a lateral wall 111f and a base surface 111g in connection with the lateral wall 111f. A first thickness T1 is formed between the base surface 111g of each of the apertures 111c and the top surface 111a of the insulating layer 111, a second thickness T2 is formed between the top surface 111a and the bottom surface 111b of the insulating layer 111, and the second thickness T2 is larger than the first thickness T1. The trace layer 112 is formed on the top surface 111a of the insulating layer 111. The chip 120 disposed on the top surface 111a of the insulating layer 111 comprises a chip surface 121 and a plurality of bumps 122, wherein the chip surface 121 is corresponded to the disposing area 111d, and the bumps 122 are electrically connected with the trace layer 112. The heat dissipation paste 130 at least fills the apertures 111c and contacts the base surface 111g of each of the apertures 111c. Preferably, the heat dissipation paste 130 is in contact with the lateral wall 111f of each of the apertures 111c and the bottom surface 111b of the insulating layer 111 for raising the contact area between the heat dissipation paste 130 and the insulating layer 111. Therefore, the coupling strength between the heat dissipation paste 130 and the insulating layer 111 can be significantly increased. In this embodiment, the heat dissipation paste 130 comprises a plurality of heat conducting particles 131, mentioned heat conducting particles 131 can be chosen from tin, silver, copper, indium, lead, antimony, gold, bismuth, aluminum, alumina, aluminum nitride, boron nitride, titanium boride, titanium diboride, silicon carbide and graphite. The sealing resin 140 is formed on the top surface 111a of the insulating layer 111 and covers the bump 122 of the chip 120. For the reason that each of the apertures 111c is disposed at the disposing area 111d of the bottom surface 111b of the insulating layer 111 and comprises the lateral wall 111f and the bottom surface 111g, the apertures 111c can be filled with the heat dissipation paste 130, and the lateral wall 111f and the base surface 111g of each of the apertures 111c are in contact with the heat dissipation paste 130 to raise the contact area between the heat dissipation paste 130 and the insulating layer 111. Therefore, the coupling strength between the heat dissipation paste 130 and the insulating layer 111 can be effectively increased. Besides, when a sealing resin 140 is formed on the top surface 111a of the insulating layer 111, the sealing resin 140 can be limited between the chip 120 and the insulating layer 111, a dam for blocking the sealing resin 140 is no longer needed. Therefore, mentioned design possesses functions of cost saving and shorter processing duration.

Next, with reference to FIGS. 3A to 3D, the figures illustrate a manufacturing flow in accordance with a preferable embodiment of the present invention. First, referring to FIG. 3A, providing a substrate 110 having an insulating layer 111 and a trace layer 112, the insulating layer 111 comprises a top surface 111a and a bottom surface 111b, wherein the bottom surface 111b of the insulating layer 111 comprises a disposing area 111d and a non-disposing area 111e located at outside of the disposing area 111d, and the trace layer 112 is formed on the top surface 111a of the insulating layer 111; next, referring to FIG. 3B, disposing a chip 120 on the top surface 111a of the insulating layer 111, the chip 120 comprises a chip surface 121 and a plurality of bumps 122, the chip surface 121 is corresponded to the disposing area 111d, and the bumps 122 are electrically connected with the trace layer 112; thereafter, referring to FIG. 3C, forming a sealing resin 140 on the top surface 111a of the insulating layer 111 and covering the bumps 122 of the chip 120 with the sealing resin 140; then, referring to FIG. 3D, applying a laser to remove part of the insulating layer 111 to enable the bottom surface 111g to form a plurality of apertures 111c, each of the apertures 111c is located at the disposing area 111d and comprises a lateral wall 111f and a base surface 111g in connection with the lateral wall 111f, a first thickness T1 is formed between the base surface 111g of each of the apertures 111c and the top surface 111a of the insulating layer 111, a second thickness T2 is formed between the top surface 111a and the bottom surface 111b of the insulating layer 111, and the second thickness T2 is larger than the first thickness T1; eventually, filling the bottom surface 111b and the apertures 111c with a heat dissipation paste 130 to form a thin flip chip package structure 100 as shown in FIG. 2.

Figure 4:
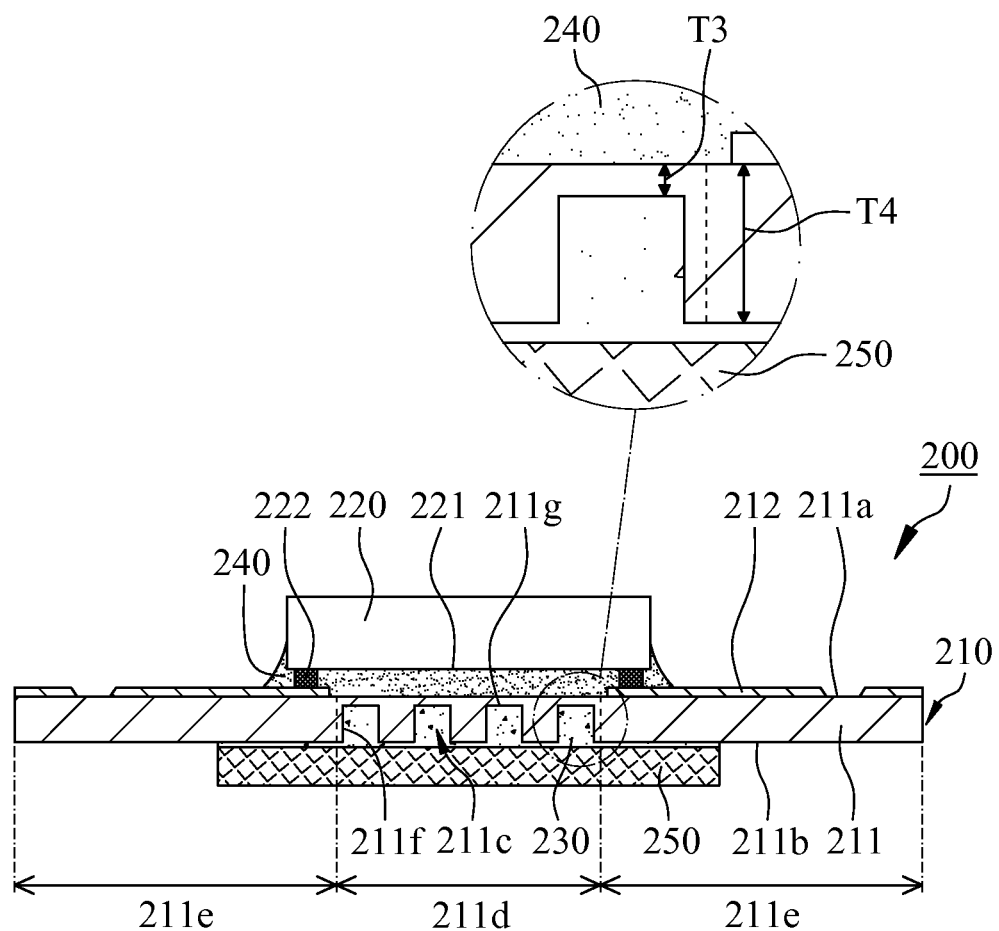
FIG. 4 is another cross-sectional schematic diagram illustrating the thin flip chip package structure in accordance with a preferred embodiment of the present invention.

With reference to FIG. 4, mentioned figure illustrate another thin flip chip package structure 200 in accordance with another preferred embodiment. The thin flip chip package structure 200 comprises a substrate 210, a chip 220, a heat dissipation paste 230, a sealing resin 240 and a heat dissipation plate 250. The substrate 210 comprises an insulating layer 211 and a trace layer 212, the insulating layer 211 comprises a top surface 211a, a bottom surface 211b and a plurality of apertures 211c formed at the bottom surface 211b, wherein the bottom surface 211b of the insulating layer 211 comprises a disposing area 211d and a non-disposing area 211e. Each of the apertures 211c is located at the disposing area 211d and comprises a lateral wall 211f and a base surface 211g in connection with the lateral wall 211f. A first thickness T3 is formed between the base surface 211g of each of the apertures 211c and the top surface 211a of the insulating layer 211, a second thickness T4 is formed between the top surface 211a and the bottom surface 211b of the insulating layer 211, and the second thickness T4 is larger than the first thickness T3. The trace layer 212 is formed on the top surface 211a of the insulating layer 211. The chip 220 disposed on the top surface 211a of the insulating layer 211 comprises a chip surface 221 and a plurality of bumps 222, wherein the chip surface 221 is corresponded to the disposing area 211d, and the bumps 222 are electrically connected with the trace layer 212. The heat dissipation paste 230 at least fills the apertures 211c and contacts the base surface 211g of each of the apertures 211c. Preferably, the heat dissipation paste 230 is in contact with the lateral wall 211f of each of the apertures 211c and the bottom surface 211b of the insulating layer 211 to raise the contact area between the heat dissipation paste 230 and the insulating layer 211. Therefore, the coupling strength between the heat dissipation paste 230 and the insulating layer 211 can be significantly increased. The sealing resin 240 is formed on the top surface 211a of the insulating layer 211 and covers the bump 222 of the chip 220. The heat dissipation plate 250 is disposed at the bottom surface 211b of the insulating layer 211 and contacts with the heat dissipation paste 230 for raising heat dissipation efficiency.

While this invention has been particularly illustrated and described in detail with respect to the preferred embodiments thereof, it will be clearly understood by those skilled in the art that it is not limited to the specific features and descriptions and various modifications and changes in form and details may be made without departing from the spirit and scope of this invention.

What is claimed is:

1. A thin flip chip package structure comprises:
   a substrate having an insulating layer and a trace layer, the insulating layer comprising a top surface, a bottom surface and a plurality of apertures formed at the bottom surface,
   wherein the bottom surface of the insulating layer comprising a disposing area and a non-disposing area located at outside of the disposing area, each of the apertures is located at the disposing area and comprising a lateral wall and a base surface in connection with the lateral wall,
   a first thickness is formed between the base surface of each of the apertures and the top surface of the insulating layer,
   a second thickness is formed between the top surface and the bottom surface of the insulating layer, the second thickness is larger than the first thickness, and the trace layer is formed on the top surface of the insulating layer;
   a chip disposed on the top surface of the insulating layer, the chip comprising a chip surface and a plurality of bumps electrically connected with the trace layer,
   wherein the chip surface is corresponded to the disposing area; and
   a heat dissipation paste at least filling the apertures, and the bottom surface of each of the apertures is in contact with the heat dissipation paste.

2. The thin flip chip package structure in accordance with claim 1,
   wherein the heat dissipation paste is in contact with the lateral wall of each of the apertures.

3. The thin flip chip package structure in accordance with claim 1,
   wherein the heat dissipation paste is in contact with the bottom surface of the insulating layer.

4. The thin flip chip package structure in accordance with claim 1 further comprises a sealing resin formed on the top surface of the insulating layer, and the bumps of the chip are covered by the sealing resin.

5. The thin flip chip package structure in accordance with claim 1,
   wherein the heat dissipation paste comprises a plurality of heat conducting particles, the heat conducting particles can be chosen from tin, silver, copper, indium, lead, antimony, gold, bismuth, aluminum, alumina, aluminum nitride, boron nitride, titanium boride, titanium diboride, silicon carbide and graphite.

6. The thin flip chip package structure in accordance with claim 1 further comprises a heat dissipation plate in contact with the heat dissipation paste.

* * * * *